(12) United States Patent
Lin et al.

(10) Patent No.: US 10,325,884 B2
(45) Date of Patent: Jun. 18, 2019

(54) APPARATUSES AND METHODS FOR SCALABLE MEMORY

(71) Applicant: Micron Technology, Inc., Boise, ID (US)

(72) Inventors: Feng Lin, Boise, ID (US); Yuanzhong Wan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/199,460

(22) Filed: Nov. 26, 2018

(65) Prior Publication Data

US 2019/0096855 A1 Mar. 28, 2019

Related U.S. Application Data

(62) Division of application No. 15/174,019, filed on Jun. 6, 2016, now Pat. No. 10,153,251.

(51) Int. Cl.
| | | |
|---|---|---|
| *G11C 11/00* | (2006.01) | |
| *G11C 7/02* | (2006.01) | |
| *H01L 25/065* | (2006.01) | |
| *G11C 7/10* | (2006.01) | |
| *G11C 11/4076* | (2006.01) | |
| *G11C 11/4091* | (2006.01) | |
| *G11C 7/22* | (2006.01) | |

(52) U.S. Cl.
CPC ........ *H01L 25/0657* (2013.01); *G11C 7/1066* (2013.01); *G11C 7/1093* (2013.01); *G11C 11/4076* (2013.01); *G11C 11/4091* (2013.01); *G11C 7/222* (2013.01); *H01L 2225/06541* (2013.01); *H01L 2225/06565* (2013.01)

(58) Field of Classification Search
CPC ............ G11C 5/04; G11C 5/02; G11C 5/025; G11C 11/4093; G11C 11/4096; G11C 8/06; G11C 16/26; G11C 2029/4402; G11C 7/10
See application file for complete search history.

(56) References Cited

U.S. PATENT DOCUMENTS

| | | |
|---|---|---|
| 7,292,500 B2 | 11/2007 | Liu et al. |
| 8,582,339 B2 | 11/2013 | Rajan |
| 8,797,779 B2 | 8/2014 | Rajan et al. |
| 8,917,564 B2 | 12/2014 | Yu et al. |
| 2006/0200634 A1 | 9/2006 | Yoshida et al. |
| 2010/0091537 A1* | 4/2010 | Best .......................... G11C 5/02 365/51 |

(Continued)

OTHER PUBLICATIONS

Tran, et al. "HBM: Memory Solution for High Performance Processors" SK Hynix Inc., Oct. 2014, 31 pp.

*Primary Examiner* — Hien N Nguyen
(74) *Attorney, Agent, or Firm* — Brooks, Cameron & Huebsch, PLLC

(57) ABSTRACT

Apparatuses and methods are provided for scalable memory. An example apparatus comprises a logic component, a plurality of memory components adjacent to and coupled to one another and the logic component, a plurality of memory component programmable delay lines (PDLs), of the plurality of memory component PDLs associated with a respective one of the plurality of memory components, and a logic component programmable delay line (LPDL) coupled to the logic component and each of the plurality of memory component PDLs.

20 Claims, 7 Drawing Sheets

(56) References Cited

U.S. PATENT DOCUMENTS

| | | | |
|---|---|---|---|
| 2014/0104935 A1* | 4/2014 | Ware | G06F 13/4068 365/154 |
| 2014/0176187 A1 | 6/2014 | Jayasena et al. | |
| 2014/0181483 A1 | 6/2014 | O'Connor et al. | |
| 2015/0324290 A1 | 11/2015 | Leidel et al. | |
| 2016/0181214 A1 | 6/2016 | Oh et al. | |

* cited by examiner

APPARATUSES AND METHODS FOR SCALABLE MEMORY

PRIORITY INFORMATION

This application is a Divisional of U.S. application Ser. No. 15/174,019 filed Jun. 6, 2016, the contents of which are included herein by reference.

TECHNICAL FIELD

The present disclosure relates generally to semiconductor memory and methods, and more particularly, to apparatuses and methods for scalable memory.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource (e.g., CPU) can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing device and/or system.

In many instances, the processing resources (e.g., processor and/or associated functional unit circuitry) may be external to the memory array, and data is accessed via a bus between the processing resources and the memory array to execute a set of instructions. Processing performance may be improved in a memory device, in which a processor may be implemented internal and/or near to a memory (e.g., directly on a same chip as the memory array). A memory device may save time by reducing and/or eliminating external communications and may also conserve power. Data movement between and within arrays and/or subarrays of various memory devices, can affect processing time and/or power consumption.

Some computing systems can include a plurality of memory components coupled to one another and to a logic component to form a stacked memory system (e.g., a memory cube, a hybrid memory cube (HMC), etc.). Stacked memory systems can be formed with various memory component stack configurations and may be designed for use in certain applications based on memory density, bandwidth, and/or input/output (I/O) speed associated with the stacked memory system.

DETAILED DESCRIPTION

Figure 1:
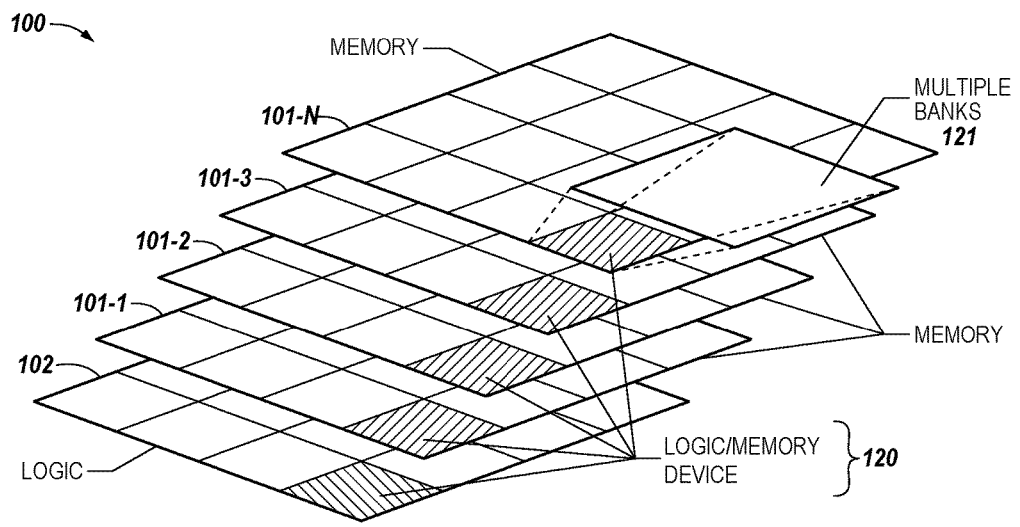
FIG. 1 is a representation of a computing system in accordance with a number of embodiments of the present disclosure.

The present disclosure includes apparatuses and methods for scalable memory. An example apparatus comprises a logic component and a plurality of memory components adjacent to and coupled to one another and the logic component. The apparatus includes a plurality of memory component programmable delay lines (PDLs), each memory component PDL of the plurality of memory component PDLs associated with a memory component among the plurality of memory components. A logic component programmable delay line (LPDL) is coupled to the logic component and each memory component PDL.

In some approaches, a plurality of memory components coupled to one another and to a logic component can form a stacked memory system (e.g., a memory cube). The stacked memory system may be coupled to a memory interface and may be managed by the logic component. For example, the logic component may provide signals to the stacked memory system to cause the memory components of the stacked memory system to perform certain functions and/or operations. However, as the voltage, temperature, fabrication processes and/or operations performed by the stacked memory system are subject to variations, managing the memory interface and/or stacked memory system can become challenging. In addition, in various approaches, memory density and/or bandwidth usage can create a burden on memory interface and/or stacked memory system design, and may lead to increases in power consumption and increased component complexity.

As the number of memory components used in a stacked memory system increases, various challenges may arise. For example, stacked memory systems that include more than eight adjacent, coupled memory components (e.g., memory die) can present challenges to through silicon via (TSV) assembly and/or manufacturing. As the number of memory components of the stacked memory system increases, resistance and capacitance loading through the TSVs can lead to a decrease in memory interface performance.

Another challenge regarding increasing the number of memory components associated with a stacked memory system is related to timing (e.g., clocking). In some approaches, a self-aligned strobe connection is used, in which strobe TSVs are self-addressed to each memory component in the stacked memory system. In order to compensate timing differences between data propagation and strobe propagation, a programmable delay line (PDL) has been added to the logic component for each strobe path (e.g., for each strobe TSV). In some approaches, this can lead to the total number of TSVs associated with the strobe increasing as the number of memory components increases.

In contrast, embodiments of the present disclosure may mitigate these problems and/or provide a stacked memory system including a variable number of memory components (e.g., memory die). For example, as opposed to some approaches that include one strobe per memory component (e.g., self-aligned strobe), examples of the present disclosure provide for a shared strobe configuration that may include select logic. In some embodiments, a decode component and/or a timing component may be coupled to one or more memory components instead of coupled to the logic component, as in some approaches.

In some embodiments, voltage regulation (e.g., open-loop regulation) may be applied to one or more timing paths associated with the stacked memory system. A ring oscillator including a replicated clock tree may be included and may be configured to calibrate operation variations in the memory components using, for example, various voltages. Voltage and temperature variations may also be tracked using the ring oscillator, and may be adjusted using a delay line coupled to the stacked memory system.

The logic component may comprise logic that is partitioned among a number of separate logic/memory devices (also referred to as "partitioned logic") and which is coupled to timing circuitry for a given logic/memory device. The partitioned logic on a logic component at least includes control logic that is configured to execute instructions to cause operations to be performed on one or more memory components. At least one memory component includes a portion having sensing circuitry associated with an array of memory cells. The sensing circuitry may include a sense amplifier and a compute component. The array may be a dynamic random access memory (DRAM) array and the operations can include logical AND, OR, and/or XOR Boolean operations. The timing circuity and the control logic may be in different clock domains and operate at different clock speeds. The timing circuitry may be separate from other control logic used to control read and write access requests for the array, e.g., in a DRAM array.

In some embodiments, a logic/memory device allows input/output (I/O) channel control over a bank or set of banks allowing logic to be partitioned to perform logical operations between a memory (e.g., dynamic random access memory (DRAM)) component and a logic component. Through silicon vias (TSVs) may allow for additional signaling between a logic layer and a DRAM layer. Through silicon vias (TSVs) as the term is used herein is intended to include vias which are formed entirely through or partially through silicon and/or other single, composite and/or doped substrate materials other than silicon. Embodiments are not so limited. With enhanced signaling, a memory operation may be partitioned between components, which may further facilitate integration with a logic component's processing resources, e.g., a memory controller in a logic component.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 101 may reference element "01" in FIG. 2, and a similar element may be referenced as 301 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a representation of a computing system in accordance with a number of embodiments of the present disclosure. In the example system of FIG. 1, the computing system 100 (e.g., a memory cube or system on a chip (SoC)) includes a plurality of adjacent and coupled memory components 101-1, 101-2, . . . , 101-N (referred to collectively as 101) which are further coupled to a logic component 102. According to various embodiments the plurality of adjacent and coupled memory components 101-1, . . . , 101-N may be in the form of a plurality of individual memory die and/or distinct memory layers formed as integrated circuits on a chip. The plurality of memory components 101 can further be partitioned into distinct portions 121 of the plurality of memory components 101, e.g., partitioned into separate and distinct dynamic random access memory (DRAM) banks on each memory component 101.

Similarly, the logic component 102 may be in the form of an individual logic die and/or distinct logic layers formed as integrated circuits on a chip. In this example, the system 100 provides three dimensions (3D) by stacking the plurality of memory components 101 and interconnecting at least one memory component 101-1, . . . , 101-N and to a logic component 102 to collectively form a logic/memory device 120. The plurality of memory components 101-1, . . . , 101-N can be coupled to the logic component 102 using I/O paths, e.g., through silicon vias (TSVs) (not shown). The manner in which TSVs, either entirely or partially through silicon or other single, composite and/or doped substrate material, may be used to interconnect the components is well understood.

As used herein an apparatus is intended to mean one or more components, devices and/or systems which may be coupled to achieve a particular function. A component, as used herein, is intended to mean a die, substrate, layer, and/or integrated circuitry. As used herein, a device may be formed within or among components. Thus, as used herein, a "device" such as a memory device may be wholly within a memory component. Additionally, however, a device such as a logic/memory device is intended to mean some combination of logic and memory components. According to embodiments, a memory device, logic device, and/or logic/memory device all include devices able to perform a logical operation, e.g., an apparatus able to perform a Boolean logical operation.

TSV manufacturing techniques enable interconnection of multiple die layers in order to construct three-dimensional dies. This ability to interconnect multiple die layers permits building a memory device with a combination of memory storage layers and one or more logic layers. In this manner, the device provides the physical memory storage and logical memory transaction processing in a single electronic device package. The arrangement shown in FIG. 1 is to illustrate an example configuration. Embodiments described herein, however, are not limited to this example and/or a particular die/layer arrangement.

The system 100 example shown in FIG. 1 may provide a very compact and power efficient package with an available (e.g., maximum) bandwidth capacity of 320 GB/s per system. The illustrated system 100 may be capable of high bandwidth via a hierarchical and parallel approach to the design. A device hierarchy may occur across the logic and memory components and hardware parallelism may occur in a planar manner across a given component.

In the example of FIG. 1, a combination and/or organization of logic and memory resources between the plurality of memory components 101-1, . . . , 101-N and one or more logic components 102 for the system 100 may be referred to as a logic/memory device 120. Through-silicon vias (TSVs) may interconnect each of the memory components 101-1, . . . , 101-N and one or more logic components 102, e.g., die and/or layers for each logic/memory device 120. In the illustration of FIG. 1, the system 100 is shown organized into sixteen (16) logic/memory devices 120 with each device associated with at least a portion of the logic component 102 and a portion of one or more of the plurality of memory components 101-1, . . . , 101-N. Embodiments, however, are not limited to this example. Embodiments can include geometric and/or numerical configurations different from that described and illustrated in FIG. 1.

Figure 2:
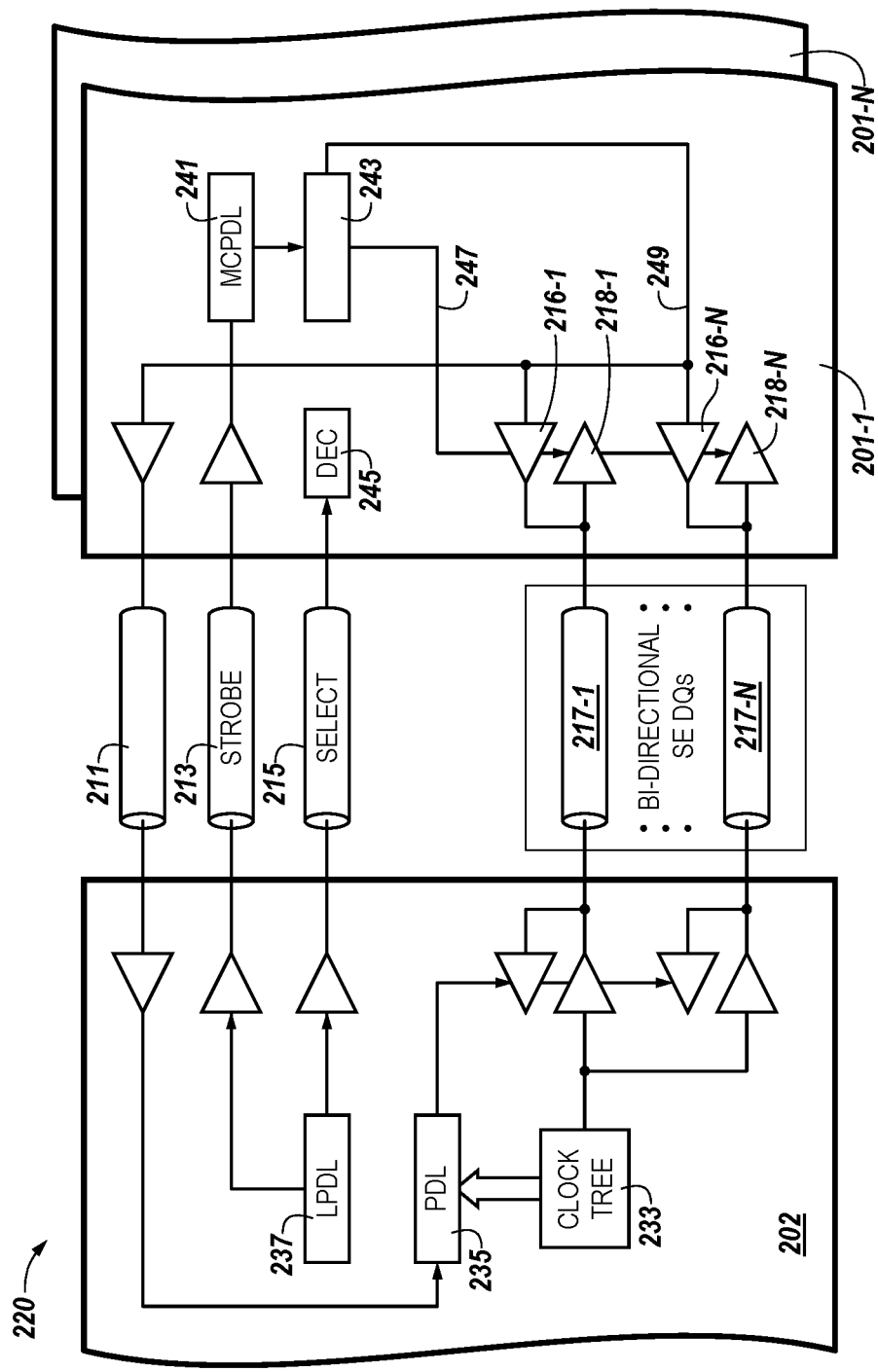
FIG. 2 is a schematic representation of a computing system having a logic component and a memory component in accordance with a number of embodiments of the present disclosure.

FIG. 2 is a schematic representation of a computing system having a logic component and a memory component in accordance with a number of embodiments of the present disclosure. In the example of FIG. 2, a single memory component 201 is shown; however, a plurality of memory components 201 may be adjacent to, and coupled to one another as illustrated in FIG. 2 to form a stacked memory system. As shown in FIG. 2, the logic/memory device 220 (e.g., stacked memory system) includes a logic component 202, and a memory component 201. The logic component includes a clock tree 233 coupled to a programmable delay line (PDL) 235. The logic component 202 also includes a logic programmable delay line 237.

The logic component 202 is coupled to the memory components 201-1, . . . , 201-N (referred to generally herein as memory component 201) by TSV channels (e.g., TSV channels coupling logic component 202 and memory components 201). For example, the logic component 202 is coupled to the memory component 201 by signal lines 211, 213, and 215, which are located at least partially in TSV channels 214. In some embodiments, signal line 211 may be a return data strobe signal line, signal line 213 may be a shared strobe signal line, and signal line 215 may be a data select signal line. In addition, a plurality of bi-directional data signal lines 217-1, . . . , 217-N are coupled to the logic component 202 and the memory component 201 through TSVs.

In some embodiments, the memory component 201 includes a clock distribution network 243, memory component programmable delay line 241, decode component 245, data write strobe signal line 247, and data read strobe signal line 249. In addition, a plurality of logic devices 216-1, . . . , 216-N and 218-1, . . . , 218-N are coupled to the memory components 201-1, . . . , 201-N. In some embodiments, the plurality of logic devices may include I/O circuits (e.g., transceivers). In the example embodiment shown in FIG. 2, the plurality of I/O circuits may include transmitters 216-1, . . . , 216-N, and receivers 218-1, . . . , 218-N, etc.

By including at least a portion of the programmable delay line (e.g., the memory component programmable delay line 241) on the memory component 201, the number of components on the logic component 202 may be reduced and/or the design of the logic component 202 may be simplified in comparison to some approaches. For example, by providing the memory component PDL 241 on the memory component 201, a single logic programmable delay line 237 may be provided on the logic component 202 regardless of a number of memory component 201-1, . . . , 201-N layers that comprise a stacked memory system. For example, in some embodiments, a memory component PDL 241 may be associated with each memory component 201 partition, and a single logic component PDL 237 may be in communication with each memory component PDL 241.

In some embodiments, the logic component PDL 237 can provide multiple signals to a given memory component 201 over shared strobe signal line 213 and data select signal line 215 such that the signal carried over strobe signal line 213 is received at a given memory component PDL 241, and the signal carried over data select signal line 215 is received at the decoder 245.

The clock tree 233 on the logic component 202 can distribute clock signals to various partitions on the logic component 202. For example, the clock tree 233 can provide clock signals to PDL 235 and/or logic component PDL 237. In some embodiments, the clock tree 233 may be used to receive and/or transmit data signals to the memory component 201 over bi-directional data signal lines 217-1, . . . , 217-N.

In some embodiments, the memory component PDL 241 may be initially held at a minimum threshold delay. The logic component PDL 237 may be configured to place a strobe signal to the slowest memory component 201 using select signals 215 (e.g., strobe signal WSs 369, illustrated in FIG. 3) at a center of a data valid window (e.g., data valid window 365 illustrated in FIG. 3) by altering a delay associated with the logic component PDL 237. As used here, a data valid window (e.g., a "data eye") is an amount of time over which data can be reliably sampled by a component receiving the data. In some embodiments, a delay associated with a memory component PDL 241 can be altered. For example, a delay associated with each memory component PDL 241 of each memory component 201 in a stacked memory system can be altered to compensate for timing variations among the signals.

In some embodiments, strobe signals may be activated on return strobe signal line 211 and/or shared strobe signal line 213 concurrently with a select signal that is activated on data select signal line 215. In this example, a delay (e.g., a matched delay) may be added to compensate timing differences in the signals. For example, a delay that corresponds to an amount of delay between the strobe signals and the select signal may be added by the decode logic 245 to compensate for differences in the timing between the signals. In some embodiments, a select signal may be activated on data select signal line 215 prior to activating strobe signals on return strobe signal line 211 and/or shared strobe signal line 213. In this example, the timing of the signals may not require compensation, and a delay (e.g., a matched delay) may not be added.

In some embodiments, a variable delay line may be provided at the memory component PDL 241. The variable delay line may include a phase mixer. In some embodiments, the variable delay line may be configured as a trombone-type delay line; however, other delay line configurations may be used to achieve a similar result. The phase mixing may be performed between gates associated with the variable delay line.

Figure 3:
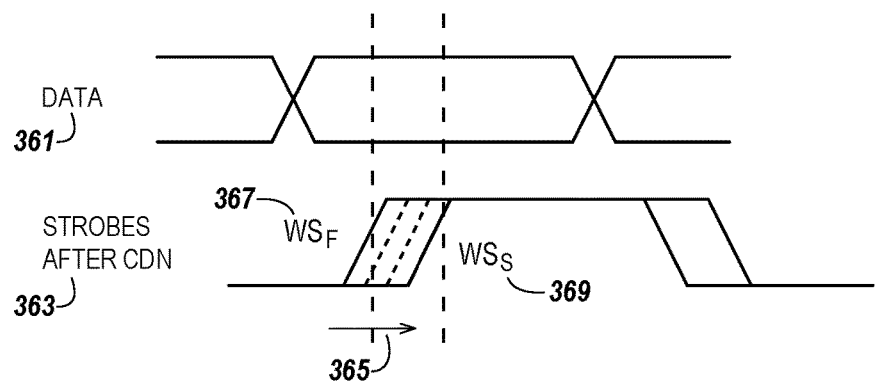
FIG. 3 is a timing diagram for operation of a computing system in accordance with a number of embodiments of the present disclosure.

FIG. 3 is a timing diagram for operation of a computing system in accordance with a number of embodiments of the present disclosure. As illustrated in FIG. 3, data signal 361 and strobes WSF 367 and WSs 369 are provided. In some embodiments, the strobes are strobes after synchronization from the clock distribution network 363 (e.g., clock distribution network (CDN) 243 illustrated in FIG. 2). In some embodiments, a strobe signal WSs 369 from the slowest memory component of the stack (e.g., memory component 201 illustrated in FIG. 2) is placed at a center of a data valid window 365, and a strobe signal WSF 367 from the fastest memory component of the stack is provided at a different location of the data valid window 365. With a shared strobe architecture, arrival of the strobe signal to the input of different memory components (memory components 201 illustrated in FIG. 2) may be the same. A propagation delay across a strobe receiver, memory component PDL 241, and CDN 243 may vary depending on process, voltage and temperature (PVT) variations. These PVT-induced delay variations may create timing differences, for example, the slow and fast strobe signals in a memory stack as illustrated in FIG. 3.

Figure 4:
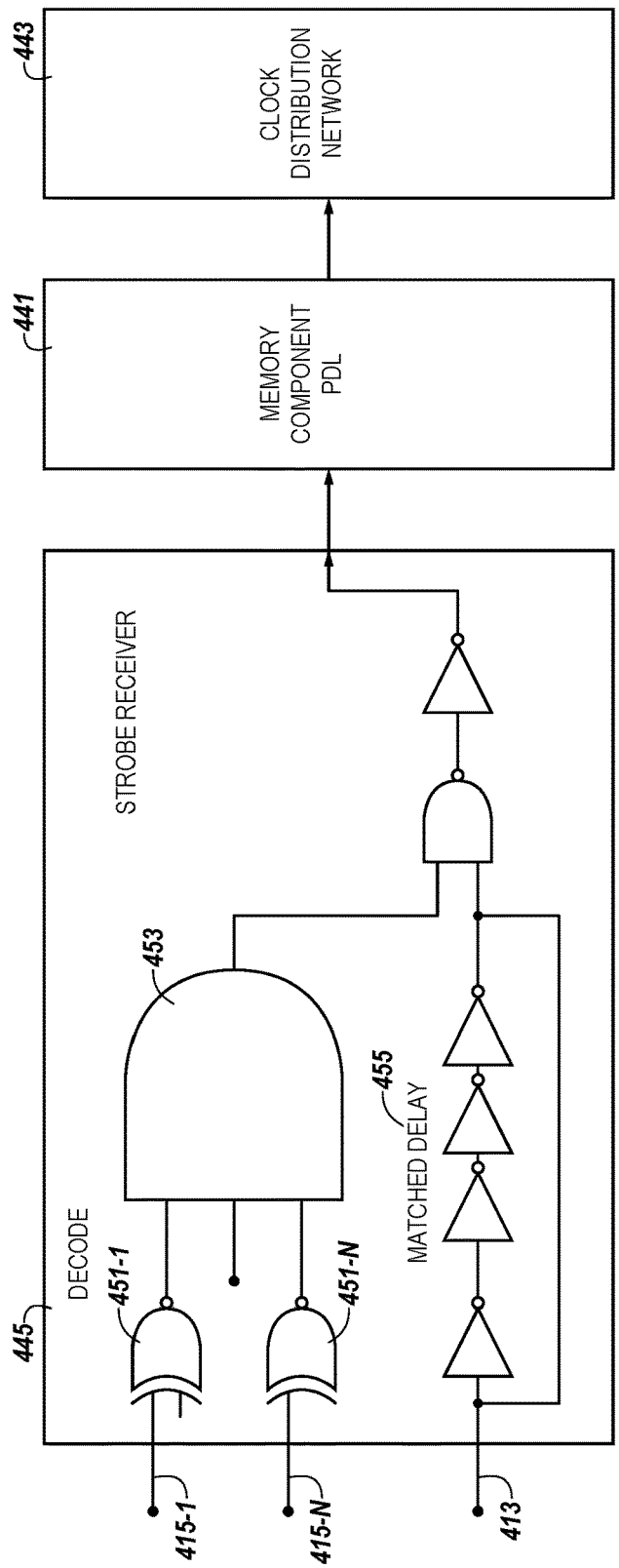
FIG. 4 is a schematic representation of a computing system having a decode component, a memory component programmable delay line, and a clock distribution network in accordance with a number of embodiments of the present disclosure.

FIG. 4 is a schematic representation of a computing system having a decode component 445, a memory component programmable delay line 441, and a clock distribution network 443 in accordance with a number of embodiments of the present disclosure. As illustrated in FIG. 4, decode component 445 can include a plurality of logic devices 451-1, . . . , 451-N and 453 configured to receive select signals 415-1, . . . , 415-N, and a matched delay component 455 configured to receive a strobe signal 413 (as discussed in more detail in connection with FIG. 2). In some embodiments, logic devices 451-1, . . . , 451-N are XOR gates, and logic gate 453 is a AND gate.

In some embodiments, select signals 415-1, . . . , 415-N, and strobe signal 413 are received to the decode component 445 from data select signal line (e.g., data select signal line 215 illustrated in FIG. 2) and shared strobe signal line (e.g., shared strobe signal line 213 illustrated in FIG. 2), respectively.

Figure 5:
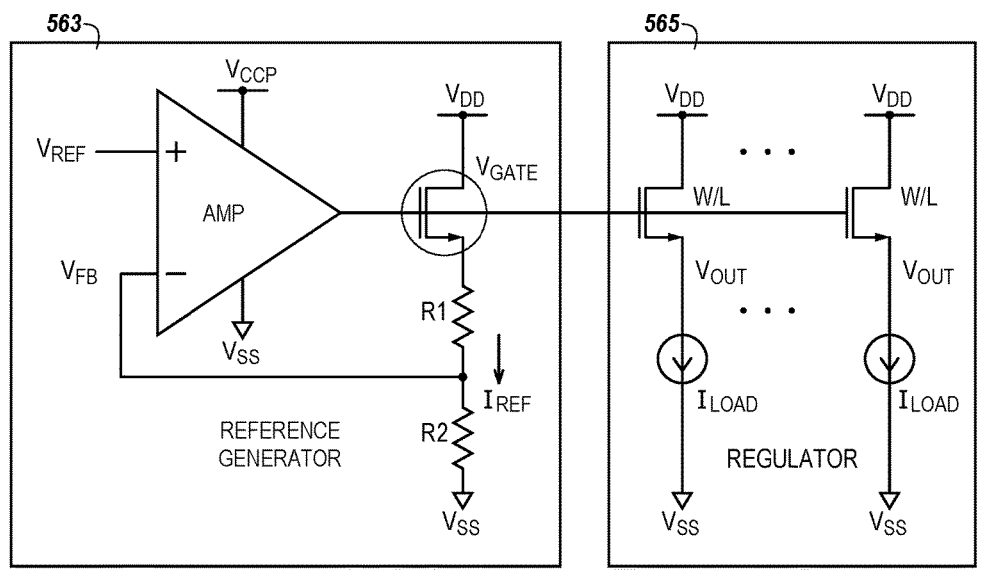
FIG. 5 is a schematic representation of a voltage regulator in accordance with a number of embodiments of the present disclosure.

FIG. 5 is a schematic representation of a voltage regulation system in accordance with a number of embodiments of the present disclosure. In some approaches, closed-loop voltage regulation is used to control voltages associated with the computing system and/or logic/memory device (e.g., computing system 100 illustrated in FIG. 1, logic/memory device 220 illustrated in FIG. 2, etc.). In contrast, in some embodiments, an open-loop voltage regulation system as illustrated in FIG. 5 is provided.

As illustrated in FIG. 5, the voltage regulation system includes a reference generator 563 to generate a reference voltage, and a voltage regulator 565 to maintain a particular voltage. In some embodiments, the voltage regulation system may be used in place of, or in addition to, a clock distribution network (e.g., CDN 243 illustrated in FIG. 2, CDN 443 illustrated in FIG. 4, etc.). In some embodiments, voltage regulator 565 supplies a current ($I_{LOAD}$) to the clock distribution network. A common reference voltage ($V_{GATE}$) is provided by reference generator 563. As illustrated in FIG. 5, with the exception of the feedback path through the AMP (e.g., $V_{FB}$), all the drivers illustrated in FIG. 5 are open-loop. In some embodiments, the open-loop drivers illustrated in FIG. 5 are configured to minimize a load capacitance in order to increase circuit response time in comparison with a closed-loop architecture.

In some embodiments, a clock signal associated with the stacked memory system may be provided intermittently to reduce power consumption. For example, clocking signals may not be provided continuously to reduce power consumption associated with the stacked memory system. In some embodiments, when the clock signal is not active (e.g., when the clock signal is stopped), the load current ($I_{LOAD}$)) is reduced to a minimum value and the regulated voltage ($V_{OUT}$) can drift to a higher voltage than when the clock signal is active. $V_{OUT}$ can be calculated based on Equation 1, where $V_{REF}$ is the bandgap reference voltage for the AMP (e.g., an operation amplifier), $V_{INT}$ is the internal regulated voltage, W and L are the width and length of N-channel devices associated with the voltage regulation system, and $R_2$ is a resistor in the feedback path. In some embodiments, when the clock signal is re-applied, the load change can drive $V_{OUT}$ lower, which may cause a temporary timing jitter before the voltage settles (e.g., reaches an operating value).

$$V_{OUT} = V_{INT} + \sqrt{2(V_{REF}R_2)/K\left(\frac{W}{L}\right)} - \sqrt{2(I_{LOAD})/K\left(\frac{W}{L}\right)} \quad \text{(Eq. 1)}$$

In some embodiments, a replicated N-channel source follower associated with the reference generator 563 can be used to track process and/or temperature variations associated with the stacked memory system, and may adjust $V_{GATE}$ to compensate for such variations. In some embodiments, the resistor divider in the feedback path illustrated in FIG. 5 can be adjusted (e.g., trimmed) to alter a voltage value associated with the voltage regulator 565.

In some embodiments, a delay model of the clock path (e.g., clock path shown in FIG. 4) may be created to monitor a critical timing path associated with stacked memory system. For example, a counter that may be incremented in response to start and/or stop signals generated by a controller may be provided to record timing differences due to process and/or temperature variations associated with the stacked memory system. In some embodiments, process variations (e.g., variations due to manufacturing processes) can be calibrated by applying different values for $V_{GATE}$. For example, at a "slow" memory component associated with the stacked memory system a higher $V_{OUT}$ may be applied to the regulated path than for a "fast" memory component associated with the stacked memory system. For example, a $V_{OUT}$ value of 1.1 Volts may be applied to the "slow" memory component, while a $V_{OUT}$ value of 0.9 Volts may be applied to the "fast" memory component. Embodiments are not limited to these specific voltage values, and different voltage values may be used for $V_{OUT}$ depending on the specific process variations for a given memory component in the stacked memory system.

In some embodiments, a PDL (e.g., memory component PDL 241 illustrated in FIG. 2 and/or memory component programmable delay line 441 illustrated in FIG. 4) may be added to each memory component in the stacked memory system to provide timing adjustments. With an additional PDL, each memory component may have a longer timing path than a previous memory component that does not have a PDL in the stacked memory system. In some embodiments, timing compensation using voltage regulation, as described in connection with FIG. 5, may be provided to each memory component to reduce or eliminate timing sensitivity of a critical timing path. For example, a replicated delay model may be provided to monitor a regulated timing path in one or more memory components in the stacked memory system in connection with applying different values for $V_{GATE}$. In some embodiments, a clock signal and/or a strobe signal may be provided to the memory components, and a respective voltage to each memory component may be controlled such that a timing difference of respective clock paths associated with at least two different memory components is substantially the same.

Figure 6A:
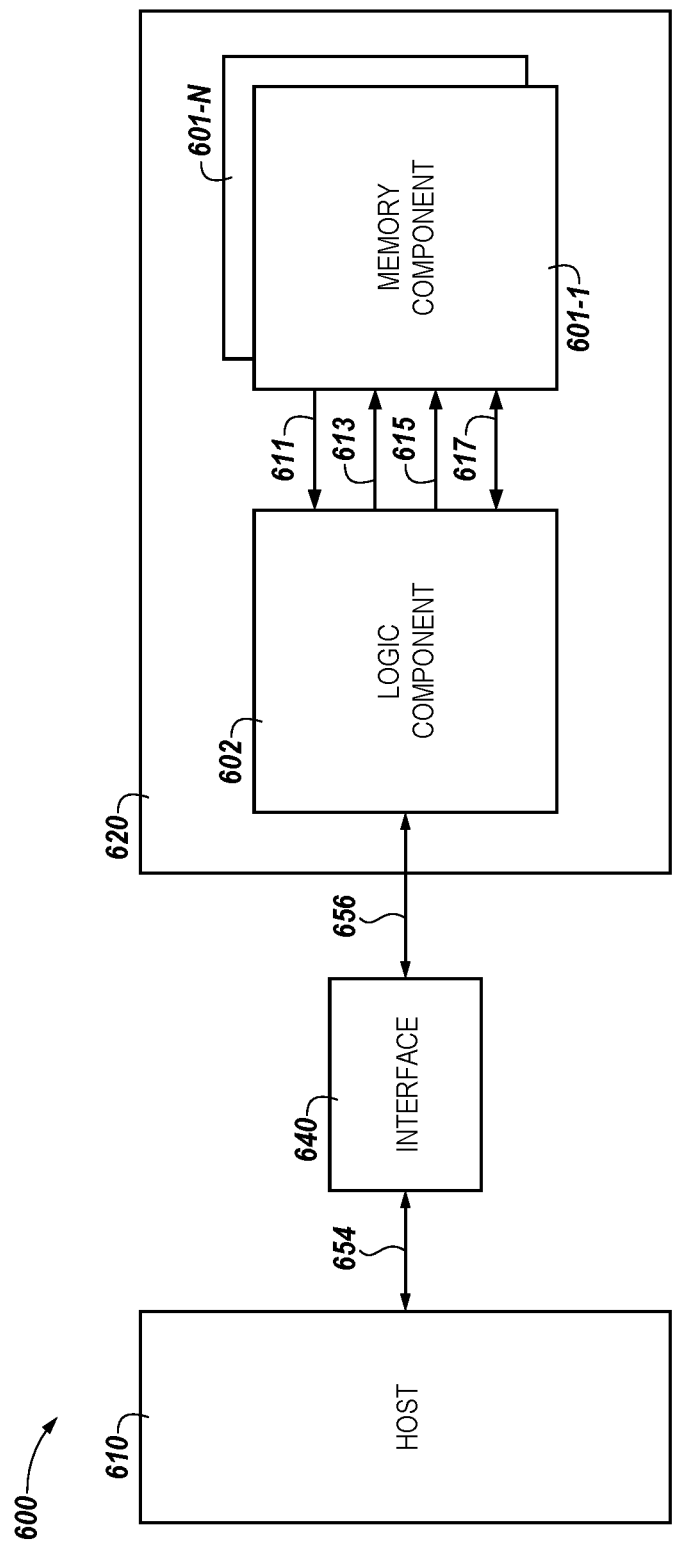
FIG. 6A is a block diagram of an apparatus in the form of a computing system including a logic component and a memory component in accordance with a number of embodiments of the present disclosure.

FIG. 6A is a block diagram of an apparatus in the form of a computing system 600 including a logic component 602 and a memory component 601 in accordance with a number of embodiments of the present disclosure. The computing system 600 may include a host 610, and an interface 640. In the example of FIG. 6A, the host 610 is communicatively coupled to the interface 640 through data path 654. The system 600 can include separate integrated circuits or may be comprised of a single integrated device as with a system on a chip. The system 600 can be, for example, a server system and/or high performance computing (HPC) system and/or a portion thereof.

In some embodiments, host 610 can include a processing resource. For example, host 610 can include a central processing unit (CPU), graphics processing unit (GPU), and/or network processing unit (NPU). In some embodiments, host 610 and/or interface 640 may include circuitry and/or instructions such that the host 610 and/or interface 640 may be configured to communicate with each other, and such that the interface 640 may be configured to communicate with the logic component 602 of the logic/memory device 620.

In some embodiments, the interface 640 is communicatively coupled to logic component 602 through data path 656. The logic component 602 may be in communication with a plurality of memory components 601-1, . . . , 601-N by signal lines 611, 613, 615, and/or bi-directional data signal lines 617, as described in more detail in connection with FIG. 2, herein. In some embodiments, logic component 602 and memory components 601-1, . . . , 601-N can comprise a logic/memory device 620, as described in more detail in connection with FIG. 2, herein.

Figure 6B:
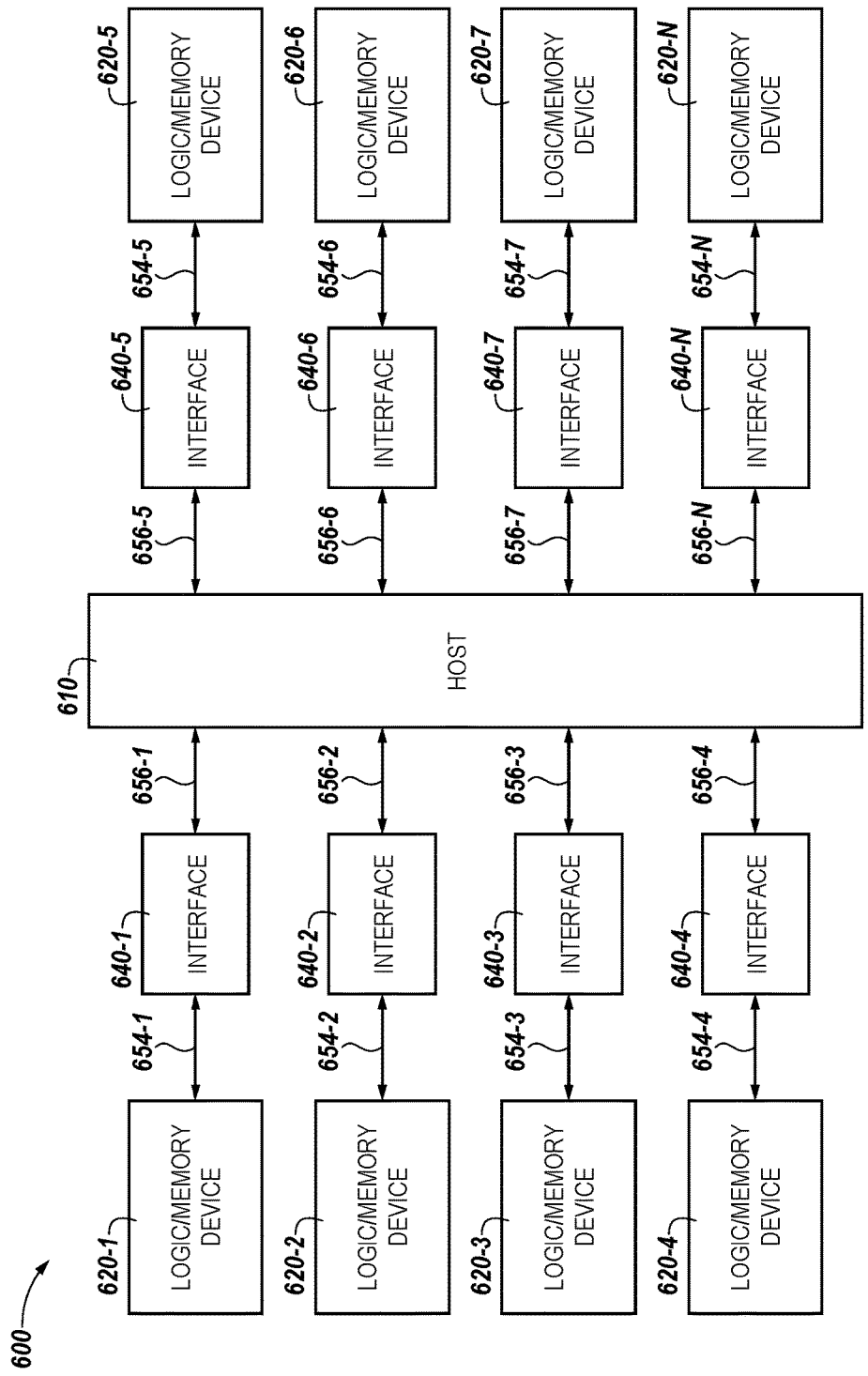
FIG. 6B is another block diagram of an apparatus in the form of a computing system including a plurality of logic/memory devices in accordance with a number of embodiments of the present disclosure.

FIG. 6B is another block diagram of an apparatus in the form of a computing system 600 including a plurality of logic/memory devices 620-1, . . . , 620-N in accordance with a number of embodiments of the present disclosure. The computing system 600 may include a host 610, and a plurality of interfaces 640-1, . . . , 640-N. In the example of FIG. 6B, an interface 640-1, . . . , 640-N is provided for each logic/memory device 620-1, . . . , 620-N. The interfaces 640-1, . . . , 640-N are communicatively coupled to logic/memory devices 620-1, . . . , 620-N through data paths 654-1, . . . , 654-N, and the interfaces 640-1, . . . , 640-N are communicatively coupled to the host 610 through data paths 656-1, . . . , 656-N.

As shown in FIG. 6B, the logic/memory devices 620-1, . . . , 620-N may be arranged around the host 610 such that some of the logic/memory devices 620-1, . . . , 620-N are located on a first side of the host 610 and some of the logic/memory devices 620-1, . . . , 620-N are located on a second side of the host 610. Embodiments are not limited to the example configuration shown in FIG. 6B; however, and the logic/memory devices 620-1, . . . , 620-N may be arranged in different location and/or orientations with respect to the host 610.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving a shared strobe signal and a plurality of strobe select signals to a memory component associated with a memory component stack;
   determining a particular memory component among the stack of memory components to be activated based, at least in part, on the shared strobe signal and the plurality of strobe select signals; and
   activating the particular memory component among the stack of memory components in response to the determination that the particular memory component is to be activated.

2. The method of claim 1, further comprising:
   activating, for at least one memory component associated with the memory component stack, a memory component programmable delay line (PDL) that is coupled to the at least one memory component, such that a delay signal associated with the memory component PDL has a delay value;
   activating a strobe signal line associated with the shared strobe signal such that the shared strobe signal has a first frequency value; and
   adjusting the delay signal associated with the memory component PDL for each memory component of the memory component stack.

3. The method of claim 2, wherein adjusting the delay signal comprises increasing the delay value for each successive memory component of the memory component stack.

4. The method of claim 1, further comprising:
   activating at least one of the strobe select signals at a first time value; and
   activating the shared strobe signal at a second time value, wherein
   the first time value is associated with an earlier point in time than the second time value.

5. The method of claim 1, further comprising:
   activating the shared strobe signal and the plurality of strobe select signals concurrently; and
   providing a matched delay signal path such that the shared strobe signal and the plurality of strobe select signals are received by respective memory components of the memory component stack concurrently.

6. The method of claim 1, further comprising receiving the shared strobe signal and the plurality of strobe select signals according to a clock signal.

7. The method of claim 6, further comprising:
   providing the clock signal while the shared strobe signal and the plurality of strobe select signals are activated; and
   stopping the clock signal in response to a determination that the shared strobe signal and the plurality of strobe select signals are not activated.

8. The method of claim 1, further comprising controlling, by a voltage regulation component, actuation of the shared strobe signal and the plurality of strobe select signals.

9. An apparatus, comprising:
   a stacked memory system, wherein the stacked memory system is configured to:
   receive, by a memory component associated with the stacked memory system, a shared strobe signal and a plurality of strobe select signals;
   determine a particular memory component associated with the stacked memory system to be activated based, at least in part, on the shared strobe signal and the plurality of strobe select signals; and
   activate the particular memory in response to the determination that the particular memory component is to be activated.

10. The apparatus of claim 9, wherein the stacked memory system is further configured to:
    activate, for at least one memory component associated with the stacked memory system, a memory component programmable delay line (PDL) that is coupled to the at least one memory component, such that a delay signal associated with the memory component PDL has a delay value;
    activate a strobe signal line associated with the shared strobe signal such that the shared strobe signal has a first frequency value; and
    adjust the delay signal associated with the memory component PDL for each memory component of the stacked memory system.

11. The apparatus of claim 9, wherein the stacked memory system is further configured to:
    activate at least one of the strobe select signals at a first time value; and
    activate the shared strobe signal at a second time value.

12. The apparatus of claim 9, wherein the stacked memory system is further configured to:
    activate the shared strobe signal and the plurality of strobe select signals concurrently; and
    provide a matched delay signal path such that the shared strobe signal and the plurality of strobe select signals are received by respective memory components of the stacked memory system concurrently.

13. The apparatus of claim 9, wherein the stacked memory system is further configured to:
    receive, by the memory component associated with the stacked memory system, the shared strobe signal and the plurality of strobe select signals according to a clock signal;
    provide the clock signal while the shared strobe signal and the plurality of strobe select signals are activated; and
    stop the clock signal in response to a determination that the shared strobe signal and the plurality of strobe select signals are not activated.

14. A system, comprising:
    a logic component coupled to a memory component stack, wherein the logic component is configured to:
    generate a shared strobe signal and a plurality of strobe select signals;
    transfer the shared strobe signal and the plurality of strobe select signals to the memory component stack; and
    a memory component stack coupled to the logic component and comprising a plurality of memory components, wherein the memory component stack is configured to:
    determine a particular memory component among the stack of memory components to be activated based, at least in part, on the shared strobe signal and the plurality of strobe select signals; and
    activate the particular memory component among the stack of memory components in response to the determination that the particular memory component is to be activated.

15. The system of claim 14, wherein the logic component is further configured to:
    activate a memory component programmable delay line (PDL) coupled to at least one memory component in the memory component stack such that a delay signal associated with the memory component PDL has a delay value; and adjust the delay signal associated with the memory component PDL for memory components in the memory component stack.

16. The system of claim 15, wherein the logic component is further configured to adjust a value associated with the delay signal by increasing the value associated with the delay signal for each successive memory component in the memory component stack.

17. The system of claim 14, wherein the logic component is further configured to transfer the shared strobe signal and the plurality of strobe select signals to the memory component stack concurrently.

18. The system of claim 14, wherein the memory component stack further comprises a voltage regulation component, and wherein the voltage regulation component is configured to control actuation of the shared strobe signal and the plurality of strobe select signals for the memory component.

19. The system of claim 14, wherein the logic component is configured to:

generate at least one of the strobe select signals at a first time; and generate the shared strobe signal at a second time.

20. The system of claim 14, wherein the logic component is further configured to provide a matched delay signal path such that the shared strobe signal and the plurality of strobe select signals are received by respective memory components of the memory component stack concurrently.

* * * * *